United States Patent

Goebel et al.

[11] Patent Number: 5,759,909
[45] Date of Patent: Jun. 2, 1998

[54] METHOD FOR MANUFACTURING A SILICON WAFER BY USING A DOPANT FOIL

[75] Inventors: Herbert Goebel; Vesna Goebel, both of Reutlingen, Germany

[73] Assignee: Robert Bosch GmbH, Stuttgart, Germany

[21] Appl. No.: 733,380

[22] Filed: Oct. 17, 1996

[30] Foreign Application Priority Data

Oct. 17, 1995 [DE] Germany ............. 195 38 612.4

[51] Int. Cl.⁶ ........................................... H01L 21/301
[52] U.S. Cl. .................... 438/558; 438/458; 438/465
[58] Field of Search .......................... 438/455, 458, 438/460, 465, 558, 560

[56] References Cited

U.S. PATENT DOCUMENTS

| | | | |
|---|---|---|---|
| 5,024,867 | 6/1991 | Iwabuchi | 438/558 |
| 5,225,235 | 7/1993 | Yoshiharu et al. | 438/916 |
| 5,240,882 | 8/1993 | Satoh et al. | 438/458 |
| 5,393,711 | 2/1995 | Biallas et al. | 438/458 |
| 5,461,002 | 10/1995 | Safir | 438/558 |
| 5,472,909 | 12/1995 | Akatsuka et al. | 438/560 |

FOREIGN PATENT DOCUMENTS

| | | |
|---|---|---|
| 0 350 531 | 1/1990 | European Pat. Off. |
| 32 07 870 | 9/1983 | Germany |

Primary Examiner—Chandra Chaudhari
Attorney, Agent, or Firm—Kenyon & Kenyon

[57] ABSTRACT

A method for manufacturing a silicon wafer, in which a diffusion process takes place. During the diffusion process, a dopant foil is applied to one side, and a neutral foil to the other side. The silicon wafers are cut out by means of wire sawing out of a silicon monocrystal, since they then exhibit an optimal surface roughness for the subsequent diffusion process.

5 Claims, 1 Drawing Sheet

METHOD FOR MANUFACTURING A SILICON WAFER BY USING A DOPANT FOIL

FIELD OF THE INVENTION

The present invention relates to a method for manufacturing a silicon wafer.

BACKGROUND INFORMATION

European Patent Application No. 0 350 531 describes a method for manufacturing a silicon wafer, where a dopant foil is applied to a silicon wafer and a large quantity of a dopant is dispensed into the silicon wafer in a subsequent diffusion step. This conventional method is applied simultaneously to both sides of the silicon wafer.

SUMMARY OF THE INVENTION

In contrast, one of the advantages of the method according to the present invention is that only a small quantity of dopants is introduced to one side of the silicon wafer. Therefore, a resultant diffusion zone exhibits only a weak doping and a small penetration depth. Thus, this layer is able to be removed quite simply in further process steps without any associated substantial loss of silicon material.

Silicon wafers are arranged in a stack to enable many silicon wafers to be processed at the same time with little consumption of doping and neutral foils. A wire saw is used to cut the silicon wafers out of a silicon monocrystal creating surfaces on the silicon wafers which are especially suited for the foil diffusion. As a result, the material consumption of silicon can be reduced, and the number of necessary reworking steps decreased. The surface of the silicon wafer that had faced the neutral foil is able to be reworked by, for example, means of lapping and polishing. Only little material consumption is associated with these processing methods.

DETAILED DESCRIPTION

Figure 1:
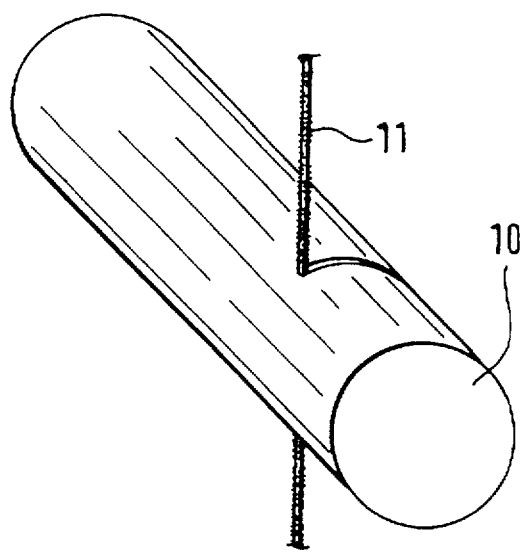
FIG. 1 shows a silicon wafer being wire-sawn out of a silicon monocrystal according to the present invention.

FIG. 1 illustrates a silicon monocrystal 10 out of which individual silicon wafers are cut by means of a wire saw 11. Silicon slices of this type are also described as silicon wafers. The wire saw 11 includes a cutting wire which is moved at a high speed. Cutting particles, such as diamond dust, are deposited on the wire. By cutting up the silicon monocrystal 10 in this manner, silicon wafers 1 with a good surface quality are obtained. The silicon wafers 1 cut out of the silicon monocrystal 10 can be further processed immediately following a cleaning step without necessitating an additional ablation step on the surface to improve the surface quality of the silicon wafers 1. In addition, thus produced surfaces exhibit a certain micro-roughness, which promotes a penetration of dopants.

Figure 2:
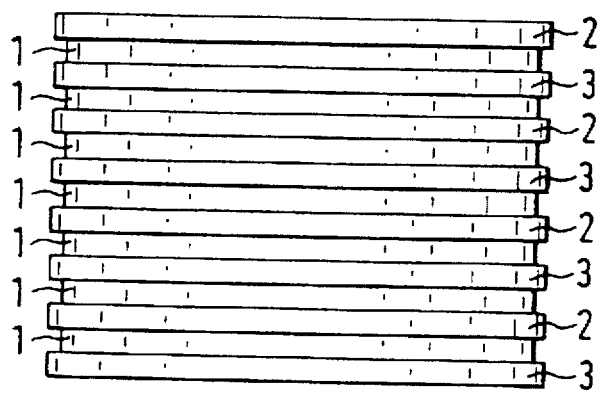
FIG. 2 shows a stack of silicon wafers with foils disposed therebetween according to the present invention.

FIG. 2 illustrates the further processing of the obtained silicon wafers 1. Each silicon wafer 1 has two sides, whose surfaces are formed by means of wire-sawing. A diffusion foil 2 is applied to one of these surfaces, and a neutral foil 3 to the other. As described in the European Patent Application No. 0 350 531, the diffusion foil is composed of an organic binding agent, an inorganic binding agent and a dopant. A highest possible dopant concentration is selected to ensure heavy doping of silicon wafers 1. The neutral foils 3 includes an organic binding agent and an inorganic binding agent. Preferably, the neutral foil 3 should not contain any dopants whatsoever, which could effect a doping of silicon wafers 1. In practice, it is difficult to achieve a neutral foil 3 that is free of dopants. It is also difficult to consistently predict which impurities will be present. Therefore, a small quantity of dopant is provided for the neutral foil 3 to enable precise adjustment of the doping of the silicon wafer 1 on the side facing the neutral foil 3.

As shown in FIG. 2, a plurality of silicon slices 1 are expediently arranged with a plurality of diffusion foils 2 and neutral foils 3 in a stack. Apart from the top and bottom foil, each diffusion foil 2 and each neutral foil 3 are disposed between two silicon wafers 1. Thus, the required number of foils is kept low, and many silicon wafers 1 can be processed in one diffusion step. The stack shown in FIG. 2 is subsequently diffused. This causes the organic binding agent to decompose, and the diffusion substance penetrates into the surfaces of the silicon wafers 1. The silicon wafers 1 are prevented from lying directly on one another by the inorganic binding agent. Given ample diffusion time, the dopant is then driven into the depth of the silicon wafers 1. Following the diffusion step, the individual silicon wafers 1 are separated from one another.

Figure 3:
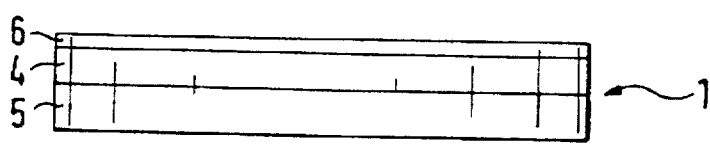
FIG. 3 shows a single silicon wafer after a diffusion step.

A silicon wafer 1 of this type is shown in FIG. 3 immediately following the diffusion. On the bottom side, silicon wafer 1 has a relatively thick diffusion zone 5 that is produced by the dopants of a doping foil 2. A middle zone 4 still exhibits the original doping of silicon wafer 1 or of silicon monocrystal 10. Disposed on the top side is a relatively thin doping zone 6, which is produced by the dopants of neutral foil 3. Because of the significant difference in the dopant concentration and in the structure of the doping foils, the diffusion zone 5 on the bottom side of the silicon wafer 1 penetrates much deeper into silicon wafer 1 than does the diffusion zone 6 which extends from the top side of silicon wafer 1.

Figure 4:
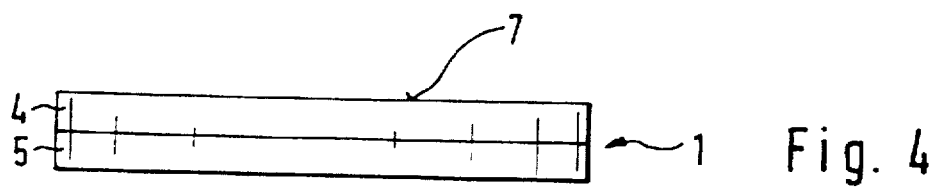
FIG. 4 shows the silicon wafer after removal of the weakly doped front-side layer.

FIG. 4 shows the silicon wafer 1 following a further processing step in which the top layer 6 was removed. This is done, for example, by means of lapping and polishing, so that an especially smooth surface 7 is then created, which is particularly well suited for a subsequent further processing to manufacture semiconductor elements, e.g., lithographic steps.

The method is suited for manufacturing so-called rear-side diffused wafers. A wafer of this type is a silicon wafer as shown in FIG. 4, the top layer 4 having a slight doping, and the bottom layer 5 having a heavy doping of the same conductivity type as the top layer 4. Silicon wafers of this type are used, for example, in the manufacturing of diodes and power transistors. It is advantageous for the bottom layer 5, which is heavily doped and, thus, has an especially low resistance, to be as thick as possible. Therefore, high dopant concentrations and long diffusion times are required. In contrast, the top layer 4 is supposed to be only slightly doped. When the bottom layer 5 is introduced by means of a diffusion process, one must avoid likewise introducing a heavily doped layer to the top side of silicon slice 1.

This is achieved quite simply under the present method according to the present invention by using a neutral foil having an especially small dopant concentration. In addition, it is possible to use a dopant of the opposite conductivity type for the small dopant concentration of the neutral foil, so that in the intermediate step as shown in FIG. 3, the top layer 6 has, for example, a p-type doping, and the two bottom layers 4 and 5, for example, an n-type doping. The top p-doped layer 6 is then able to be removed quite simply through a selective etching process. The thickness of the top layer 6 is the p-n junction between the p-doped top layer 6 and the n-doped layer 4.

Because of the small dopant concentration of neutral foil 2, only a thin surface layer is p-doped, so that only a small thickness of silicon wafer 1 must be ablated. Therefore, the method is especially economical. In addition, the consumption of silicon material is also kept low as a result of the wire sawing according to the present invention, since the cutting width can be kept especially small during the wire-sawing operation. Furthermore, the damage to the surface is perceptibly less when a wire sawing process is used instead of a conventional sawing with an inner fret saw (e.g., rotating circular band saw), the silicon wafers can be used for the diffusion process immediately following the sawing process, without requiring additional processing steps in which the silicon material is ablated. Thus, by combining the wire saws and the foil diffusion process, there is very little loss of silicon material.

What is claimed is:

1. A method for manufacturing at least one silicon wafer, comprising the steps of:

(a) applying at least one dopant foil having a high dopant concentration to a first side of the at least one silicon wafer;

(b) diffusing the at least one dopant foil after the applying step (a);

(c) applying at least one neutral foil having a low dopant concentration to a second side of the at least one silicon wafer during the diffusion step (b); and (d) arranging a plurality of the at least one silicon wafer, a plurality of the at least one dopant foil and a plurality of the at least one neutral foil in a stack during the diffusion step (b).

2. The method according to claim 1, wherein the at least one silicon wafer is extracted from a silicon monocrystal using a wire sawing process and is treated with a diffusion process without ablating the at least one silicon wafer.

3. The method according to claim 1, further comprising the step of:

(e) lapping and polishing the second side of the at least one silicon wafer after the diffusion step (b).

4. The method according to claim 1, wherein, before the diffusion step (b), the at least one silicon wafer has a uniform and slight first conductivity type doping concentration, and wherein, before the diffusion step (b), the at least one dopant foil has the first conductivity type doping concentration.

5. The method according to claim 1, wherein the at least one neutral foil has a second small conductivity type doping concentration.

* * * * *